United States Patent
Darwall et al.

[11] Patent Number: 6,133,060
[45] Date of Patent: Oct. 17, 2000

[54] METHOD OF PROTECTING LIGHT SENSITIVE REGIONS OF INTEGRATED CIRCUITS

[75] Inventors: Ted Darwall, Waterloo; Luc Ouellet, Granby, both of Canada

[73] Assignee: Mitel Corporation, Kanata, Canada

[21] Appl. No.: 09/010,191

[22] Filed: Jan. 21, 1998

[30] Foreign Application Priority Data

Jul. 21, 1919 [CA] Canada ................................... 2195602

[51] Int. Cl.$^7$ .................................................. H01L 21/00
[52] U.S. Cl. .................... 438/60; 438/57; 438/75
[58] Field of Search ............................. 438/597, 57, 75, 438/60

[56] References Cited

U.S. PATENT DOCUMENTS 5,256,891  10/1993  Losee et al. ............................. 257/233
5,723,884  3/1998  Kim ......................................... 257/232

*Primary Examiner*—Caridad Everhart
*Attorney, Agent, or Firm*—Marks & Clerk

[57] ABSTRACT

A semiconductor device includes at least one active region. A thick dielectric film with an opaque layer embedded therein is deposited over the light sensitive active regions to provide protection from incident light without detrimentally affecting the optical properties of an uppermost optically active layer. An active layer is deposited over the thick dielectric film.

9 Claims, 1 Drawing Sheet

METHOD OF PROTECTING LIGHT SENSITIVE REGIONS OF INTEGRATED CIRCUITS

FIELD OF THE INVENTION

This invention relates to the field of integrated circuits, and more particularly to a method and arrangement for protecting light-sensitive regions of integrated circuits, for example, optically active integrated circuits.

BACKGROUND OF THE INVENTION

The electrical performance of some types of integrated circuit is degraded by light incident upon the active regions of the devices making up the integrated circuit. Previously, the photosensitive regions of such devices, for example Charge Coupled Devices, have been protected by a light opaque film deposited on the surface of the integrated circuit, usually beneath a passivation layer. The opaque film is always located above the active components of the device and such an arrangement cannot be used in the case of a light-sensitive integrated circuit, whose topmost layer, typically a metal layer, located immediately beneath the passivation layer, is optically active. The topmost layer in such a device cannot be an optically opaque material because it would inhibit operation of the device.

This problem is particularly acute in devices intended for use in high intensity light environments, where light noise can significantly degrade the performance of the device.

An object of the invention is to provide a method of making an integrated circuit with light-sensitive regions that may include an optically active upper layer.

SUMMARY OF THE INVENTION

According to the present invention there is provided a method of making an integrated circuit comprising the steps of making an integrated circuit comprising the steps of fabricating a semiconductor device including at least one light sensitive active region; depositing over said at least one active region a dielectric film while embedding therein an opaque film to protect said at least one active region from incident light; and forming an active layer on said dielectric above said opaque layer.

Unlike the prior art, the opaque film is actually embedded in the structure of the active device and may be patterned like any other layer using conventional photoetching techniques.

Typically, the active layer is a metal layer forming a signal electrode and the opaque layer is embedded in the dielectric sandwiched between two of three active metal layers that are used in the device. Furthermore, contacts between these two sandwiching metal layers are made by means of oversized vias that are cut through the opaque layer.

The dielectric film, preferably a thick film, may be a silicon oxide, $SiO_2$, film with a metal film, such as an aluminum film, sandwiched in the middle thereof. With such an arrangement an optically active upper layer can be deposited on the thick film. The underlying light sensitive regions are protected without affecting the optical properties of the device. The $SiO_2$ film, or a portion thereof, particularly the underlayer, may be a composite film including a Spin-on glass intermediate layer sandwiched between two $SiO_2$ outer layers.

The opaque film is usually metal to ensure the required degree of opacity. It may be made of aluminum or an aluminum/TiN composite, for example.

The invention also provides an integrated circuit including a semiconductor device of the type including at least one light sensitive active region, comprising a dielectric film formed over said at least one active region, said dielectric film having embedded therein an opaque layer to protect said at least one active region from incident light, and an active layer formed over said dielectric film whereby said opaque layer is embedded in the internal structure of the device.

The integrated circuit may include a large number of semiconductor devices and the opaque layer may be patterned to cover the active regions of the devices while leaving room for the via holes.

BRIEF DESCRIPTION OF THE DRAWINGS

The invention will now be described in more detail, by way of example, only with reference to the accompanying drawings, in the single Figure is a cross section through a portion of a semiconductor device in a semiconductor structure.

DESCRIPTION OF THE PREFERRED EMBODIMENTS

Figure 1:
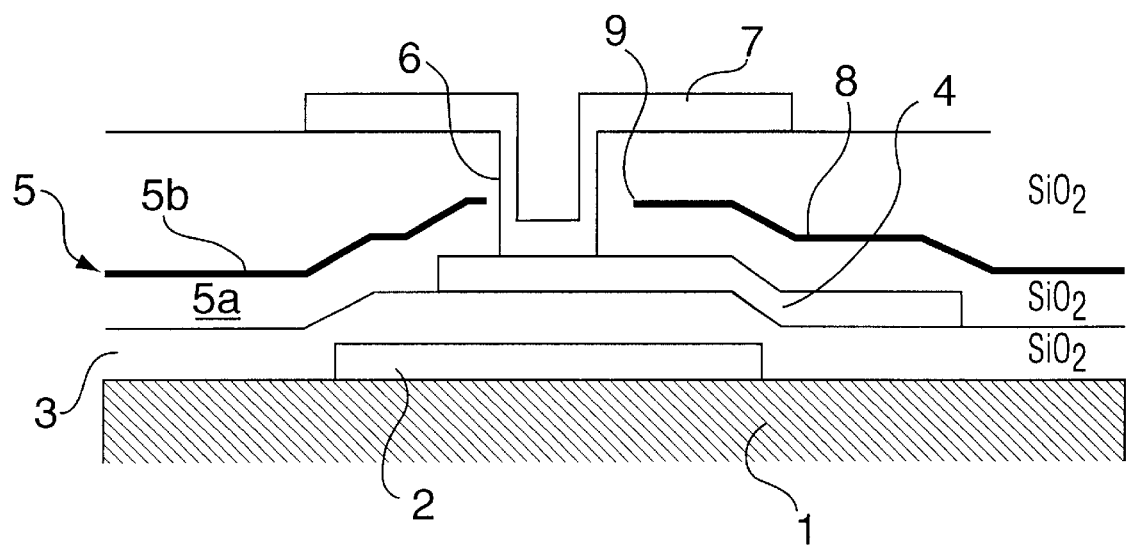

The device shown in the Figure includes a conventional silicon substrate 1 containing active components and on which is deposited a patterned metal layer 2. An $SiO_2$ layer 3 is deposited over the metal layer 2, and in turn a patterned metal layer 4 is deposited on the $SiO_2$ layer 3. The structure so far is made by using conventional, double-level metal silicon technology up to the level of the second metal 4.

Subsequently, a thick film of silicon oxide ($SiO_2$) 5 is deposited over the top surface of the second metal pattern 4 and the exposed portions of $SiO_2$ layer. The film 5 consists of a lower portion 5a and an upper portion 5b. A film 8, opaque to light, typically of aluminum, or aluminum/titanium nitride, is formed in the middle of the thick oxide film 5 on the lower portion 5a. The light opaque film 8 is typically deposited over the entire surface of the integrated circuit, but it may be patterned to cover only certain selected regions if this is required.

Using photoetching techniques, oversized vias 9 are etched in the film 8.

Upper portion 5b of film 5a is then deposited and contact vias 6 are etched through this film to the surface of the second metal. The vias 9 are larger than the contact vias 8 by typically about 2 $\mu$m to prevent the film 8 from coming into contact with the walls of the vias 6. The actual amount "oversizing" is defined by the dimensional control and alignment tolerances of the wafer fabrication process. It should be sufficiently large so that metal in the vias 6 does not touch the light opaque layer, but it should be as small as possible to minimize light leakage around these vias.

A third metal level 7 is deposited over this $SiO_2$ surface and is patterned. Contact between this third metal layer 7 and the underlying second metal layer 4 is made through the vias 6.

The opaque film 8 need not be aluminum. Any material having the required optical properties could be used for the light opaque film. A factor in the selection of the light opaque layer material is that it should not cause cracking of the oxide films within which it is sandwiched due to stress mismatches.

The light opaque layer could be sandwiched between any two metal (or other) levels that are used in an integrated circuit.

Layers 3 and 5 are typically about 1 μm thick and overlying layer 5a is typically 2 μm thick.

EXAMPLE

A light sensitive device was made by taking a semiconductor device with a metal layer 2 formed on a silicon substrate containing light sensitive active components. The metal layer 2 was 0.8 μm thick and consisted of Al.Si (1.0%).Cu(0.5%). Layer 3 was then deposited onto the metal layer 2. Layer 3 was in fact a composite layer consisting of a first 0.35 μm $SiO_2$ layer deposited by PECVD (Plasma Enhanced Chemical Vapor Deposition), an intermediate 0.4 μm SOG (Spin-on glass layer), and an upper 0.3 μm $SiO_2$ layer also deposited by PECVD.

A second metal layer 4, having the same composition and thickness as layer 2, was then deposited onto the $SiO_2$ layer 3.

Next the layer 5a was deposited over the metal layer 4. This was a composite layer consisting of a lower 0.2 PECVD layer of $SiO_2$, an intermediate 0.4 μm SOG layer, and an upper 0.2 μm PECVD layer of $SiO_2$.

The light opaque layer 8, consisting of a composite Al/Tin (0.1 μm/0.4 μm), was formed on the upper surface of the layer 5a. This was then photoetched to cut oversized vias 9 around the locations of the eventual vias 6. The inner edges of the vias 9 are located about 2 μm from the planned edges of the vias 6.

Next the layer 5b was formed on top of the opaque layer 8 by PECVD. This consisted of a 2.0 μm layer of $SiO_2$. The was then finished using a CMP (Chemical Mechanical Polish) and vias 6 cut through it to reach metal layer 4.

Finally, metal layer 7, consisting of TiN/Ti/TiN/Al/Si.Cu (0.045 μm/0.01 μm/0.045 μm/0.4 μm) was deposited on the top surface of the layer 5b so as to reach the metal layer 4 through via 6, but without making contact with the opaque layer 8 due to the "oversized" via 9.

The resulting device was tested in the presence of light flux as high as 2.5 megalux . When metal layer 7 was used a signal electrode, no discernible noise due to ambient light was observed. This is quite a remarkable result since that it shows that an active light responsive device can be constructed that will work in high ambient light environments.

The present invention can be used to shield the active regions of any light sensitive integrated circuit, but its primary application is for integrated circuits whose topmost layers are optically active in some manner.

The invention has been described for silicon integrated circuit technology, but it can equally well be used on any other integrated circuit material technology where there is a need to protect optically sensitive regions.

Although preferred embodiments of the invention have been illustrated in the accompanying drawings and described in the foregoing detailed description, it will be understood that the invention is not limited to the embodiments discloses, but is capable of numerous rearrangements, modifications and substitutions of parts and elements without departing from the spirit of the invention which is defined in the following claims.

We claim:

1. A of making an integrated circuit comprising the steps of:
   fabricating a semiconductor device including at least one light sensitive active region;
   depositing over said at least one active region a dielectric film while embedding therein a composite aluminum/titanium nitride layer providing an opaque layer to protect said at least one active region from incident light; and
   forming an active layer on said dielectric above said opaque layer.

2. A method as claimed in claim 1, wherein said active layer is a metal layer.

3. A method as claimed in claim 2, wherein said dielectric film is deposited between a pair of metal layers, one of which is said active layer, and a first via is cut through said dielectric film to establish contact between said metal layers.

4. A method as claimed in claim 3, wherein an oversized via is formed in said opaque layer around said first via so as to prevent said opaque layer from coming into contact with said metal layers.

5. A method as claimed in claim 1, wherein said dielectric film is $SiO_2$.

6. A method as claimed in claim 1, wherein said dielectric film comprises a lower portion below said opaque film and an upper portion above said opaque film, at least said lower portion being a composite layer.

7. A method as claimed in any of claim 6, wherein said lower portion includes at least one spin-on glass layer.

8. A method as claimed in any of claim 7, wherein said spin-on glass layer is sandwiched between a pair of $SiO_2$ layers.

9. A method of making an integrated circuit comprising the steps of:
   fabricating a semiconductor device including at least one light sensitive active region;
   depositing over said at least one active region a dielectric film while embedding therein an opaque layer to protect said at least one active region from incident light; and
   forming an active layer on said dielectric above said opaque layer, and
   wherein said dielectric film comprises a lower portion below said opaque film and an upper portion above said opaque film, at least said lower portion being a composite layer.

* * * * *